(12) United States Patent　(10) Patent No.: US 6,253,985 B1
Kajii　(45) Date of Patent: Jul. 3, 2001

(54) UNIT FOR SUPPLYING SOLDER BALLS

(75) Inventor: Yoshihisa Kajii, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 0 days.

(21) Appl. No.: 09/464,772

(22) Filed: Dec. 16, 1999

(30) Foreign Application Priority Data

Dec. 25, 1998　(JP) .................................................. 10-376863

(51) Int. Cl.⁷ .............................. B23K 37/00; B23K 1/00; B23K 5/00
(52) U.S. Cl. ................................. 228/41; 228/1.1; 29/840
(58) Field of Search ............................... 228/41, 246, 1.1, 228/262; 29/840

(56) References Cited

U.S. PATENT DOCUMENTS

| 4,736,780 | * | 4/1988 | Matsuo | 141/82 |
|---|---|---|---|---|
| 4,846,476 | * | 7/1989 | Hanna | 273/144 |
| 4,901,431 | * | 2/1990 | Gast | 29/707 |
| 5,279,045 | * | 1/1994 | Odashima et al. | 34/10 |
| 5,454,877 | * | 10/1995 | Worsham | 134/6 |
| 5,540,377 | * | 7/1996 | Ito | 228/41 |
| 5,687,901 | * | 11/1997 | Hoshiba et al. | 228/246 |
| 5,831,247 | | 11/1998 | Hidaka . | |
| 5,839,191 | * | 11/1998 | Economy et al. | 29/843 |
| 5,867,260 | * | 2/1999 | Sakai | 356/237 |
| 5,878,911 | * | 3/1999 | Lin et al. | 221/278 |
| 6,003,753 | * | 12/1999 | Hwang et al. | 228/41 |
| 6,069,682 | * | 5/2000 | Ishikawa | 355/47 |

\* cited by examiner

*Primary Examiner*—Patrick Ryan
*Assistant Examiner*—L. Edmondson
(74) *Attorney, Agent, or Firm*—Sughrue, Mion, Zinn, Macpeak & Seas, PLLC

(57) ABSTRACT

A unit for supplying solder balls or the like is configured to have a primary hopper for storing a number of solder balls or the like, a ball tray for storing solder balls or the like, and a ball supply path connecting the primary hopper and the ball tray. A secondary hopper connected to the primary hopper through the ball supply path is provided near the ball tray. A vibration member is added to the secondary hopper, so that solder balls or the like are supplied to the ball tray by vibration.

7 Claims, 3 Drawing Sheets

UNIT FOR SUPPLYING SOLDER BALLS

BACKGROUND OF THE INVENTION

1. Field of the Invention

The present invention relates to the improvement of a unit for supplying solder balls or the like used in a mount apparatus for mounting solder balls, solder bumps or the like on a chip or a substrate. The invention was chiefly developed with the primary object of a solder ball supply unit in a BGA (Ball Grid Array) solder ball mount apparatus.

The present application is based on Japanese Patent Application No. Hei. 10-376863, which is incorporated herein by reference.

2. Description of the Related Art

In a BGA solder ball mount apparatus, solder balls are usually put in a ball tray, and picked up from the ball tray by a mount head. After picking up has been repeated, solder calls get fewer in the ball tray. As a result, the efficiency of suction onto the mount head is impaired, so that the Performance is reduced. Therefore, solder balls are usually supplied when solder balls in the ball tray get fewer than a predetermined amount. Since it is troublesome to supply solder balls by manual operation, a large-sized ball hopper is provided, and solder balls are supplied from the hopper to the ball tray by a required amount by their own gravity, compressed-air delivery or the like.

A background-art solder ball supply unit delivers solder balls forcibly. Therefore, when solder balls are supplied into a ball tray, compressed air or the like for supplying the solder balls blows into the ball tray so that disarray is caused in the ball tray. In such a manner, there used to arise scattering in the density of solder balls in the ball tray. It is therefore necessary to pause the running of the solder ball mount apparatus in order to level the density in the ball tray, so that there has been also a problem that the performance is reduced due to the pause of the running.

SUMMARY OF THE INVENTION

It is an object of the present invention to provide a unit for supplying solder balls or the like which can supply only a required small amount of solder balls.

It is another object of the present invention to provide a unit for supplying solder balls or the like which can solve a problem when solder balls or the like are supplied into a ball tray even by use of compressed air or the like, solder balls or the like in the ball tray are blown out and one-sided to a place of the ball tray so that there arises scattering in the density of the solder balls or the like. Accordingly, it is possible to keep the solder balls or the like uniform in the ball tray without pausing a solder ball mount apparatus.

In order to achieve the above object, according to the present invention, there is provided a unit for supplying solder balls comprising: a primary hopper for storing a number of solder balls; a ball tray for storing the solder balls to be sucked on a mount head; a secondary hopper provided near the ball tray; a ball supply path connecting the primary hopper and the secondary hopper so as to supply the solder balls; and vibration means for vibrating the secondary hopper to thereby supply the solder balls to the ball tray by vibration.

Features and advantages of the invention will be evident from the following detailed description of the preferred embodiments described in conjunction with the attached drawings.

BRIEF DESCRIPTION OF THE DRAWINGS

In the accompanying drawings:

FIG. 2 shows a partially sectional right-side view showing an embodiment of a unit for supplying solder balls or the like;

DETAILED DESCRIPTION OF THE PREFERRED EMBODIMENTS

Figure 1:
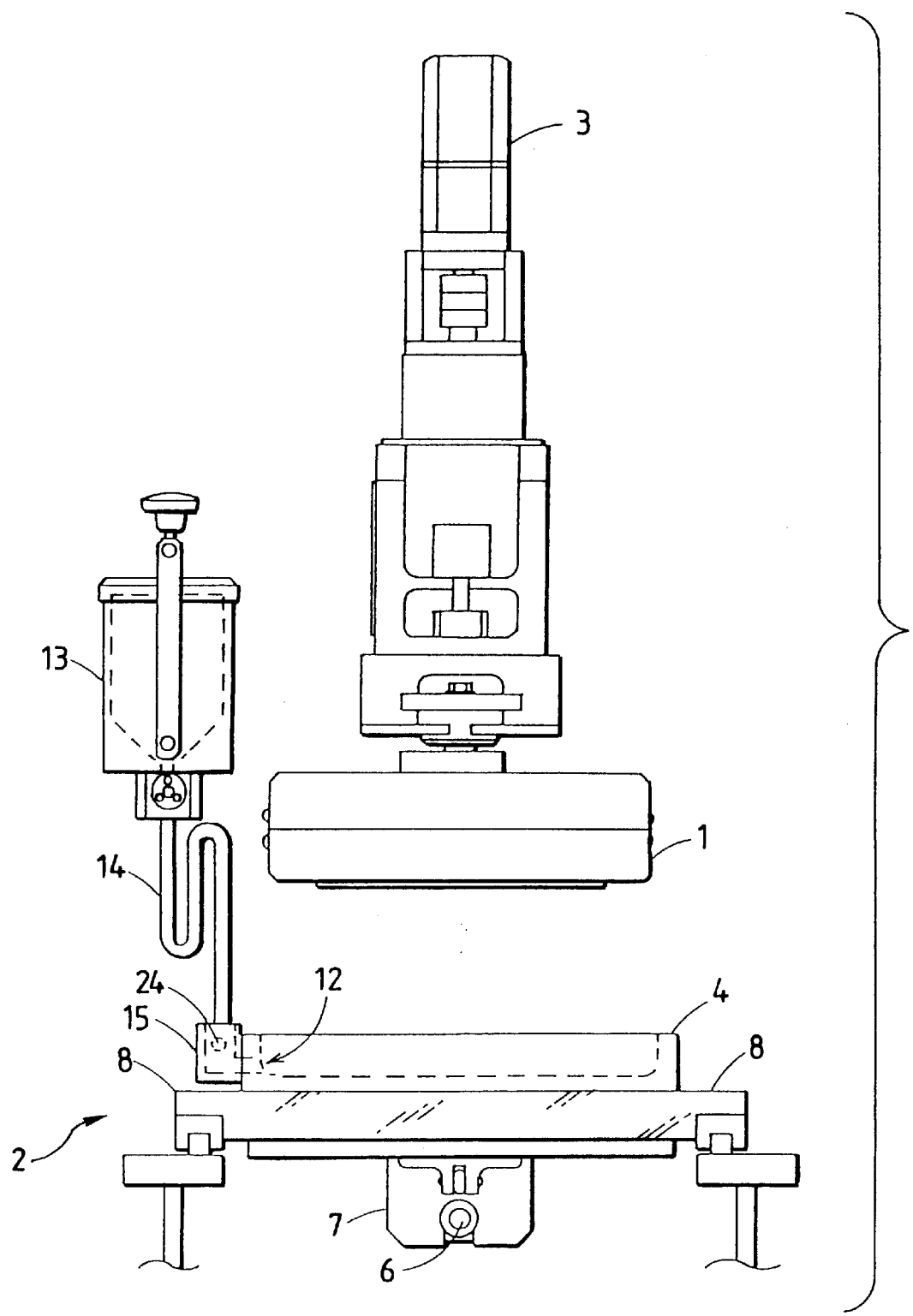
FIG. 1 shows a front view showing an embodiment of a BGA solder ball mount apparatus.

Description will be made under about an embodiment of the present invention with reference to the drawings. First, description will be made about the outline of a BGA solder ball mount apparatus using a unit for supplying solder balls or the like. FIG. 1 is a front view showing an embodiment of a BGA solder ball mount apparatus, and FIG. 2 is a partially sectional right side view showing an embodiment of a unit for supplying solder balls or the like used in the BGA solder ball mount apparatus.

The BGA solder ball mount apparatus has a mount head 1 and a solder ball supply unit 2 to which the present invention is applied. The mount head 1 is made movable only in the Z-axis direction (up/down direction) by a head driving motor 3. Therefore, though not illustrated, a mount stage is located just under the mount head 1.

Figure 2:
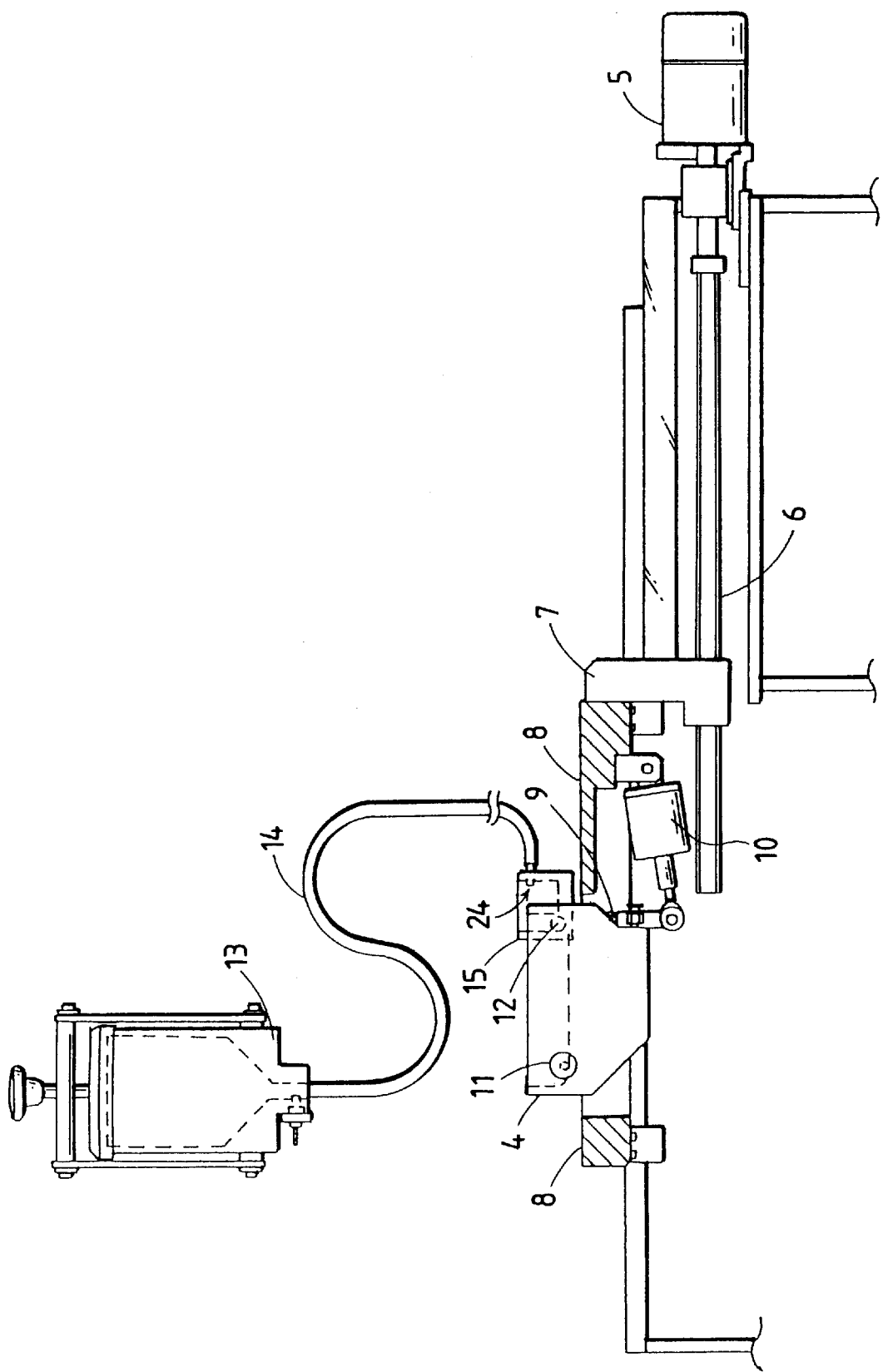
Figure 3:
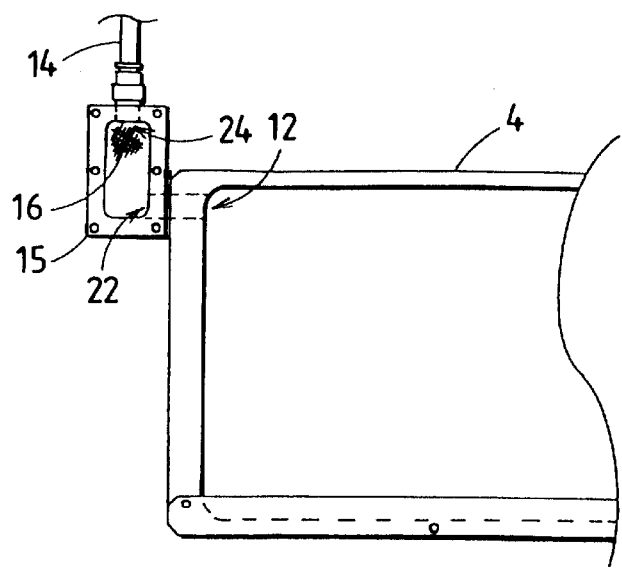
FIG. 3 shows a partially plan view showing a relationship between a secondary hopper and a ball tray.
Figure 4:
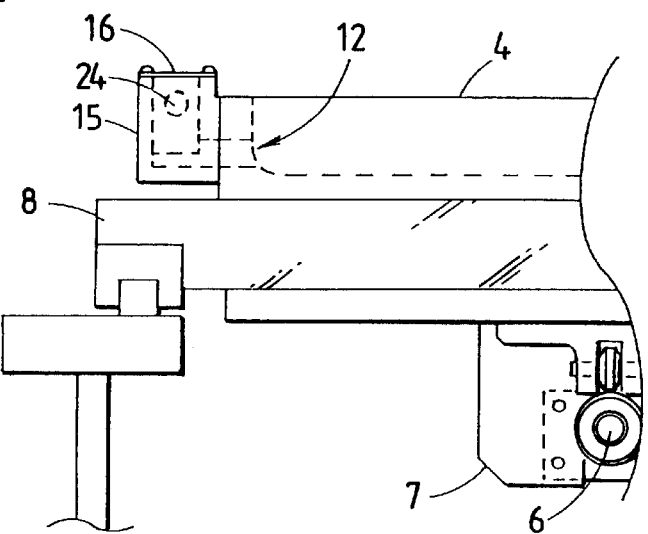
FIG. 4 shows a partially front view showing a relationship between the secondary hopper and the ball tray.
Figure 5:
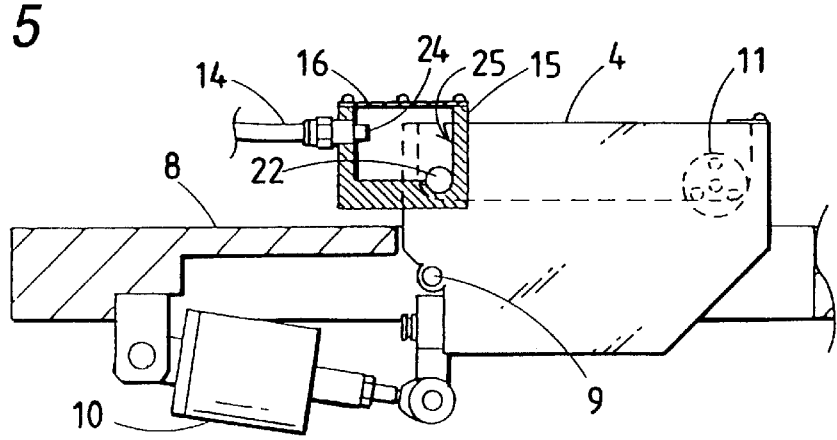
FIG. 5 shows a partially sectional left-side view showing a relationship between the secondary hopper and the ball tray.

In FIGS. 1 and 2, the reference numeral 4 represents a ball tray in which solder balls to be sucked onto the mount head 1 are stored. The inside of the ball tray 4 is made to be a solder ball storage portion. As shown in FIGS. 2 and 5, a ball residue detection sensor 11 is attached to a position which is at a predetermined height and near the bottom on the lower side in the inclination direction inside the ball tray 4, while a ball supply inlet 12 is opened near the bottom on the opposite side.

The ball tray 4 is mounted on a rotation shaft 9 attached to a table 8 for detecting the ball residue so that the ball tray 4 can rock at a fixed angle between a horizontal position and an inclined position. An air cylinder 10 is used as a driving unit for reciprocating (rocking) the ball tray 4 between the horizontal position and the inclined position.

The air cylinder 10 is attached to the table 8, and a rod of the air cylinder 10 is connected to the bottom side of the ball tray 4. When the rod of the air cylinder 10 is extended, the ball tray 4 is brought into a horizontal state with the rotation shaft 9 as a fulcrum. On the contrary, when the rod of the air cylinder 10 is contracted, the ball tray 4 is brought onto an inclined state. In the embodiment shown in FIG. 2, the of the air cylinder 10 is in the extended state, and the ball tray 4 is in the horizontal state.

The ball tray 4 of the solder ball supply unit 2 is made capable of reciprocating motion between a solder ball sucking position under the mount head 1 and a stand-by position by a ball screw 6 rotated by a ball tray moving motor 5 as shown in FIG. 2, as well as by the table 8 the ball tray 4 is attached to. The ball tray 4 in FIG. 2 is in the solder ball sucking position in front. In FIG. 2, the reference numeral 7 represents a connecting fitting for connecting the ball screw 6 and the table 8 to each other.

In FIGS. 1 and 2, the reference numeral 13 represents a large-sized primary hopper for storing a number of solder balls or the like. The hopper 13 is disposed in a position to have no influence on the elevating operation of the mount head 1. A not-shown compressed-air supply unit is connected to the primary hopper 13. The compressed-air supply unit has a compressed-air circuit having an electromagnetic valve for compressed air for supplying solder balls. The compressed-air circuit is connected to a control unit provided separately.

When the compressed-air supply unit obtains a signal indicating the residue shortage of solder balls from the control unit provided separately, the compressed-air supply unit releases the electromagnetic valve of the compressed-air circuit for a predetermined period of time so as to deliver compressed air to the primary hopper 13 in order to supply a predetermined amount of solder balls. Although compressed air is used as means for pressurizing and delivering solder balls in this embodiment, compressed nitrogen or the like may be used.

In FIGS. 1 and 2, the reference numeral 15 represents a secondary hopper, which is provided adjacently to the ball tray 4. The primary hopper 13 and the secondary hopper 15 are connected to each other through a ball supply path 14. The ball supply path 14 is constituted by a flexible tube or the like. The ball supply path 14 is formed into a substantial S-shape starting downward, thereafter bent upward on the way, and turning downward again. Owing to this shape of the ball supply path 14, solder balls are prevented from moving from the primary hopper 13 to the secondary hopper 15 only by their own gravity.

The secondary hopper 15 is formed into a box for storing solder balls temporarily. The ceiling of the secondary hopper 15 is constituted by meshes 16 so that compressed air introducing solder balls can escape through the meshes. A ball supply inlet 24 and a ball discharge outlet 22 are formed in the secondary hopper 15.

The ball supply inlet 24 is formed at the forward terminal of the ball supply path 14. Inside the secondary hopper 15, the ball supply inlet 24 is inserted to an upper portion of an inner wall which does not face the inner wall in which the ball discharge outlet 22 is formed. Therefore, the ball discharge outlet 22 is not on a secondary hopper inner wall 25 opposite to the ball supply inlet 24. Accordingly, solder balls supplied from the ball supply inlet 24 and compressed air delivered at the same time collide against the secondary hopper inner wall 25, so that the solder balls and the compressed air are damped down.

The ball discharge outlet 22 is opened in a position which is a little higher than the ball supply inlet 12 of the ball tray 4 and lower than the bottom of the secondary hopper 15. The secondary hopper 15 is fixed to the left side of the ball tray 4. The ball supply inlet 12 of the ball tray 4 and the ball discharge outlet 22 of the secondary hopper 15 are connected to each other.

The bottom of the secondary hopper 15, the ball discharge outlet 22, and the ball supply inlet 12 of the ball tray 4 connected to the ball discharge outlet 22 form successively slight downgrade. As a result, when vibration is given to the secondary hopper 15, solder balls in the secondary hopper 15 are supplied into the ball tray 4 gently in accordance with the vibration.

The ball tray moving motor 5 is also used as a vibration source in this embodiment. By means of the ball tray moving motor 5, the ball tray 4 and the secondary hopper 15 together with the table 8 repeats moving forward and backward under the mount head 1 so as to generate vibration. Therefore, although the ball tray 4 and the secondary hopper 15 vibrate integrally, an ultrasonic vibrator may be provided in the secondary hopper 15 so as to vibrate only the secondary hopper 15 as another embodiment.

Description will be made under about the procedure for operating the solder ball supply unit. After solder balls have been sucked by the mount head 1, the ball tray 4 moves backward to the stand-by position. The ball tray 4 is tilted in the stand-by position, and the residue of solder balls in the ball tray 4 is detected by the ball residue detection sensor 11. When a signal indicating that the residue of the solder balls is short is obtained, the electromagnetic valve of the compressed-air circuit is released for a predetermined period of time (about 2 seconds in this embodiment) so that a predetermined amount of solder balls are delivered from the primary hopper 13 to the secondary hopper 15.

In parallel with this motion, the mount head 1 moves down so as to mount solder balls on a substrate or the like. As soon as the mount head 1 moves up after the mount has been finished, the ball tray 4 moves forward to just under the mount head 1. After the movement, the ball tray 4 repeats moving forward and backward under the mount head 1 so as to generate vibration. Owing to this vibration, the secondary hopper 15 and the ball tray 4 vibrate simultaneously so as to supply solder balls into the ball tray 4 gradually by a small amount (approximately corresponding to a consumption in one mount). At the same time as this, the mount head 1 is moved down so as to suck solder balls, and the mount head 1 is moved up slightly. In this stage the ball tray 4 is evacuated from just under the mount head 1.

Whether there is or not suction failure is confirmed by a sensor (not shown) provided on the table 8 supporting the ball tray 4 when the ball tray 4 is evacuated. If there is suction failure, mis-sucked balls are discharged. If there is no suction failure, the ball tray 4 is evacuated, and the residue of solder balls in the ball tray 4 is detected again. If the residue of solder balls is short again, solder balls are supplied to the ball tray 4 in the above-mentioned manner.

The following effects can be obtained according to the present invention.

A secondary hopper connected to a primary hopper through a ball supply path is provided near a ball tray so that solder balls or the like are supplied from the secondary hopper to the ball tray by vibration. Accordingly, differently from the case where solder balls or the like are delivered directly from the primary hopper to the ball tray, there is no fear that solder balls in the ball tray are blown out and one-sided to a place of the ball tray, even when compressed air or the like is used for supplying the solder balls. It is therefore possible to supply a small and proper amount of solder balls or the like.

Solder balls or the like are supplied from the secondary hopper gradually by vibration, so that it is possible to supply only a required small amount of solder balls or the like. As a result, solder balls in the ball tray become difficult to deteriorate due to oxidization.

When a vibration means is to vibrate the ball tray as well as the secondary hopper, solder balls or the like in the ball tray are made uniform by vibration for supplying solder balls at the same time. It is therefore unnecessary to provide any means for leveling solder balls separately. In addition, it is also unnecessary to pause a supply unit of solder balls or the like to perform the work of leveling.

Although the invention has been described in its preferred form with a certain degree of particularity, it is understood that the present disclosure of the preferred form can be arrangement of parts without departing from the spirit and the scope of the invention as hereinafter claimed.

What is claimed is:

1. A unit for supplying solder balls comprising:

a primary hopper for storing a number of solder balls;

a ball tray for storing the solder balls to be sucked on a mount head;

a secondary hopper provided near said ball tray;

a ball supply path connecting said primary hopper and said secondary hopper so as to supply the solder balls; and vibration means for vibrating said secondary hopper to thereby supply the solder balls to said ball tray by vibration, wherein a first ball supply inlet formed at a forward terminal of said ball supply path is exposed from a first inner wall of said secondary hopper, and a ball discharge outlet for supplying the solder balls to said ball tray is formed on a second inner wall of said secondary hopper which does not face said inner wall.

2. A unit for supplying solder balls according to claim 1, wherein said vibration means vibrates said ball tray.

3. A unit for supplying solder balls according to claim 1, wherein said ball discharge outlet is formed at a higher position than a position of a second ball supply inlet of said ball tray which is connected to said ball discharge outlet.

4. A unit for supplying solder balls according to claim 2, wherein said vibration means comprises a ball tray moving motor.

5. A unit for supplying solder balls according to claim 1, additionally comprising a ball residue detection sensor which communicates with a control device to deliver said solder balls from said primary hopper to said secondary hopper when there is a shortage of said balls in said ball tray.

6. A unit for supplying solder balls comprising:

a primary hopper for storing a number of solder balls;

a ball tray for storing the solder balls to be sucked on a mount head;

a secondary hopper provided near said ball tray;

a ball supply path connecting said primary hopper and said secondary hopper so as to supply the solder balls;

vibration means for vibrating said secondary hopper to thereby supply the solder balls to said ball tray by vibration; and a ball residue detection sensor which communicates with a control device to deliver said solder balls from said primary hopper to said secondary hopper when there is a shortage of said balls in said ball tray.

7. A unit for supplying solder balls comprising:

a primary hopper for storing a number of solder balls;

a ball tray for storing the solder balls to be sucked on a mount head;

a secondary hopper provided near said ball tray;

a ball supply path connecting said primary hopper and said secondary hopper so as to supply the solder balls; and a ball tray moving motor for vibrating said secondary hopper to thereby supply the solder balls to said ball tray by vibration, and for also vibrating said ball tray.

* * * * *